United States Patent (10) Patent No.: US 8,664,848 B2
Jeong et al. (45) Date of Patent: Mar. 4, 2014

(54) ORGANIC LIGHT EMITTING DISPLAY DEVICE

(75) Inventors: Hee-Seong Jeong, Yongin (KR);
Sung-Soo Koh, Yongin (KR); Chul-Woo Jeong, Yongin (KR); Soon-Ryong Park, Yongin (KR); Chi-Wook An, Yongin (KR); Moo-Soon Ko, Yongin (KR); Ok-Byoung Kim, Yongin (KR); Woo-Suk Jung, Yongin (KR); Il-Ryong Cho, Yongin (KR); Tae-Kyu Kim, Yongin (KR); Duk-Jin Lee, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 725 days.

(21) Appl. No.: 12/855,298

(22) Filed: Aug. 12, 2010

(65) Prior Publication Data

US 2011/0205198 A1 Aug. 25, 2011

(30) Foreign Application Priority Data

Feb. 24, 2010 (KR) .................. 10-2010-0016665

(51) Int. Cl.
*H01L 51/52* (2006.01)
*H01L 51/50* (2006.01)
(52) U.S. Cl.
USPC .......................... 313/504; 313/505
(58) Field of Classification Search
USPC ................................... 313/498–512
See application file for complete search history.

(56) References Cited

U.S. PATENT DOCUMENTS 7,205,565 B2 4/2007 Im et al.
7,294,962 B2 11/2007 Kim et al.

(Continued)

FOREIGN PATENT DOCUMENTS

KR 1020050113517 12/2005
KR 100563131 3/2006

(Continued)

OTHER PUBLICATIONS

Korean Notice of Allowance issued on Oct. 31, 2011 in connection with Korean Patent Application Serial No. 10-2010-0016665 and Request for Entry of the Accompanying Office Action attached herewith.

*Primary Examiner* — Karabi Guharay
*Assistant Examiner* — Nathaniel Lee
(74) *Attorney, Agent, or Firm* — Robert E. Bushnell, Esq.

(57) ABSTRACT

An organic light emitting display device comprises: a substrate; a plurality of thin film transistors (TFTs) formed on a first surface of the substrate; a passivation layer covering the plurality of TFTs; a plurality of first pixel electrodes formed on the passivation layer and respectively electrically connected to the plurality of TFTs, and overlapping with the plurality of TFTs so as to cover the plurality of TFTs, and including a reflection layer formed of a light-reflecting conductive material; a second pixel electrode formed of a light-transmitting conductive material and disposed on the passivation layer so as to be electrically connected to the plurality of first pixel electrodes; an opposite electrode formed such that light is transmitted or reflected therethrough, and disposed opposite the plurality of first pixel electrodes and the second pixel electrode; and an organic layer interposed between the plurality of first pixel electrodes and the second pixel electrode, and including an emission layer. Accordingly, transmittivity of the organic light emitting display device is increased, and optical outcoupling efficiency of the organic light emitting display device is also increased during double-sided emission.

15 Claims, 7 Drawing Sheets

(56) References Cited

U.S. PATENT DOCUMENTS

| | | |
|---|---|---|
| 7,402,944 B2 | 7/2008 | Jeong et al. |
| 7,626,204 B2 | 12/2009 | Jeong et al. |
| 7,663,311 B2 | 2/2010 | Im et al. |
| 7,687,984 B2 | 3/2010 | Seo et al. |
| 7,710,024 B2 | 5/2010 | Kim et al. |
| 2003/0067266 A1 | 4/2003 | Kim et al. |
| 2003/0156239 A1* | 8/2003 | Inoue et al. ................... 349/113 |
| 2005/0116631 A1 | 6/2005 | Kim et al. |
| 2005/0225238 A1* | 10/2005 | Yamazaki ..................... 313/506 |
| 2005/0258740 A1* | 11/2005 | Kim ............................. 313/503 |
| 2005/0264183 A1 | 12/2005 | Seo et al. |
| 2005/0269946 A1 | 12/2005 | Jeong et al. |
| 2005/0285100 A1 | 12/2005 | Jeong et al. |
| 2006/0060850 A1 | 3/2006 | Kwak et al. |
| 2006/0060870 A1 | 3/2006 | Park et al. |
| 2006/0082292 A1 | 4/2006 | Kang et al. |
| 2006/0097632 A1 | 5/2006 | Ryu |
| 2006/0199601 A1 | 9/2006 | Cho |
| 2006/0255725 A1* | 11/2006 | Kim .............................. 313/506 |
| 2007/0090757 A1 | 4/2007 | Kim et al. |
| 2007/0238227 A1 | 10/2007 | Jun et al. |
| 2008/0111484 A1 | 5/2008 | Kwon et al. |
| 2008/0128686 A1* | 6/2008 | Kwon ............................. 257/40 |
| 2008/0142807 A1 | 6/2008 | Choe et al. |
| 2008/0143249 A1 | 6/2008 | Lee et al. |
| 2008/0218062 A1 | 9/2008 | Kim |
| 2008/0241561 A1 | 10/2008 | Jeong et al. |
| 2008/0284327 A1* | 11/2008 | Kang et al. .................... 313/504 |
| 2008/0293319 A1 | 11/2008 | Kang |
| 2009/0231243 A1 | 9/2009 | Song |
| 2009/0285977 A1 | 11/2009 | Park |
| 2010/0051929 A1 | 3/2010 | Choi |
| 2010/0099215 A1 | 4/2010 | Yang et al. |

FOREIGN PATENT DOCUMENTS

| | | |
|---|---|---|
| KR | 1020060040453 | 5/2006 |
| KR | 1020060098596 | 9/2006 |

* cited by examiner

ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 24 Feb. 2010 and there duly assigned Serial No. 10-2010-0016665.

BACKGROUND OF THE INVENTION

1. Field of the Invention

The present invention relates to an organic light emitting display device and, more particularly, to a transparent organic light emitting display device.

2. Description of the Related Art

Organic light emitting display devices have excellent characteristics in terms of angle of view, contrast, response speed, and power consumption, and thus are widely used in personal portable appliances such as MP3 players or mobile phones and TVs.

The organic light emitting display devices have self-emissive characteristics, and thus do not require a light source, unlike a liquid crystal display (LCD) device which does require a light source. Accordingly, the thickness and weight of the organic light emitting display device can be reduced.

Also, a transparent organic light emitting display device may be formed by inserting a transparent thin film transistor (TFT) or a transparent organic light emitting device thereinto.

However, in a transparent organic light emitting display device, an object or an image that is positioned on the opposite side of the user is transmitted through not only an organic light emitting device but also patterns like a TFT, various wirings, and spaces between them in a switched-off state. In addition, even when the organic light emitting display device is a transparent display device, the transmittivity of the organic light emitting device, the TFT, and the wirings described above is not high, and the spaces between them are very small. Accordingly, the transmittivity of the organic light emitting display device is not high.

Also, the user may see a distorted image due to the patterns described above, that is, the organic light emitting device, the TFT, and the wirings. Since distances between the patterns are several hundred nanometers, which is the same as a visible light wavelength, diffusion of light that has been transmitted occurs.

Meanwhile, compared to an LCD device, a both (bottom and top) emission type display device may be easily manufactured using the organic light emitting display device.

However, since the reflective anode cannot be used in the both emission type display device, optical resonance effects may not be used, which makes it difficult to obtain a high outcoupling efficiency. If a transparent anode is changed to a semi-transmissive anode to increase the outcoupling efficiency of the both emission type display device, the transmittivity of the organic light emitting display device is lowered. Thus, it is difficult to manufacture a transparent organic light emitting display device.

SUMMARY OF THE INVENTION

The present invention provides a transparent organic light emitting display device having a transmission area with increased transmittivity and increased outcoupling efficiency during double-sided light emission.

The present invention also provides a transparent organic light emitting display device in which diffusion of light being transmitted is reduced to prevent distortion of the transmission image.

According to an aspect of the present invention, an organic light emitting display device comprises: a substrate; a plurality of TFTs formed on a first surface of the substrate; a passivation layer covering the plurality of TFTs; a plurality of first pixel electrodes formed on the passivation layer and respectively electrically connected to the plurality of TFTs, the electrodes being overlapped with the plurality of TFTs so as to cover the plurality of TFTs and including a reflection layer formed of a light-reflecting conductive material; a second pixel electrode formed of a light-transmissible conductive material and is disposed on the passivation layer so as to be respectively electrically connected to the plurality of first pixel electrodes; an opposite electrode formed such that light is transmitted and reflected therethrough and is disposed opposite to the plurality of first pixel electrodes and the second pixel electrode; and an organic layer interposed between the plurality of first and second pixel electrodes and the opposite electrode and including an emission layer.

The opposite electrode may comprise at least one metal selected from the group consisting of Ag, Mg, Al, Pt, Pd, Au, Ni, Nd, Ir, Cr, Li, Ca, and alloys thereof.

The second pixel electrode may be formed of at least one metal oxide selected from the group consisting of ITO, IZO, ZnO, and $In_2O_3$.

The plurality of first pixel electrodes and the second pixel electrode may be connected to each other.

The reflection layer may comprise at least one metal selected from the group consisting of Ag, Mg, Al, Pt, Pd, Au, Ni, Nd, Ir, Cr, Li, Ca, and alloys thereof.

According to another aspect of the present invention, an organic light emitting display device comprises: a substrate partitioned into a transmission area and a plurality of first pixel areas that are spaced apart from one another between the transmission area; a plurality of pixel circuit units formed on a first surface of the substrate, each of the pixel circuits comprising at least one TFT and being formed in each of the plurality of first pixel areas; a passivation layer covering the plurality of pixel circuit units and formed in the transmission area and the plurality of first pixel areas; a plurality of first pixel electrodes formed on the passivation layer and respectively electrically connected to the plurality of pixel circuits, the electrodes being overlapped with the plurality of pixel circuits so as to cover the plurality of pixel circuits and including a reflection layer formed of a light-reflecting conductive material; a second pixel electrode formed of a light-transmissible conductive material and disposed on the passivation layer so as to be respectively electrically connected to the plurality of first pixel electrodes; an opposite electrode formed such that light is transmitted and reflected therethrough and disposed opposite to the plurality of first pixel electrodes and the second pixel electrode; and an organic layer interposed between the plurality of first and second pixel electrodes and the opposite electrode and including an emission layer.

The opposite electrode may comprise at least one metal selected from the group consisting of Ag, Mg, Al, Pt, Pd, Au, Ni, Nd, Ir, Cr, Li, Ca, and alloys thereof.

The second pixel electrode may be formed of at least one metal oxide selected from the group consisting of ITO, IZO, ZnO, and $In_2O_3$.

The plurality of first pixel electrodes and the second pixel electrode may be connected to each other.

The reflection layer may comprise at least one metal selected from the group consisting of Ag, Mg, Al, Pt, Pd, Au, Ni, Nd, Ir, Cr, Li, Ca, and alloys thereof.

The organic light emitting display device may further comprise a plurality of conductive lines electrically connected to the plurality of pixel circuit units, wherein at least one of the conductive lines is arranged to overlap with each of the first pixel electrodes.

The passivation layer may be formed of a transparent material.

A second emission area, in which light is emitted toward the substrate and the opposite electrode, may be disposed in at least a portion of the transmission area corresponding to the second pixel electrode.

A plurality of insulating layers may be disposed in an area corresponding to the transmission area.

At least one of the plurality of insulating layers may comprise an opening formed in at least an area of the second pixel area.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
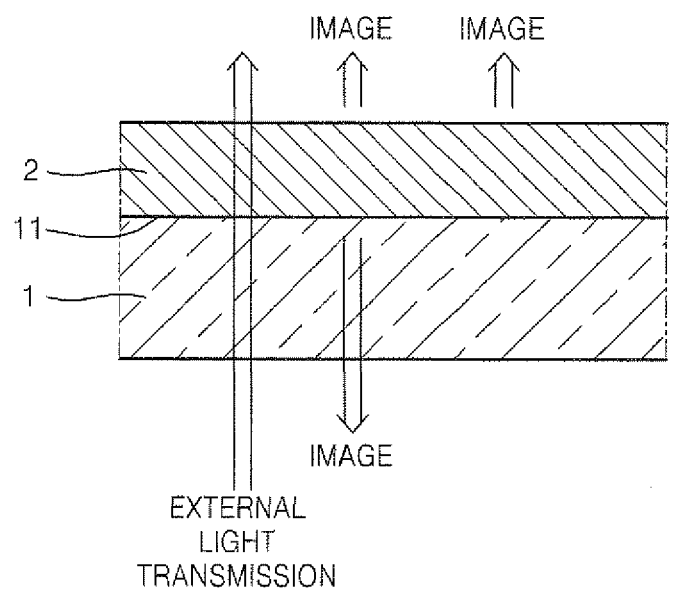
FIG. 1 is a cross-sectional view illustrating an organic light emitting display device according to an embodiment of the present invention.

FIG. 1 is a cross-sectional view illustrating an organic light emitting display device according to an embodiment of the present invention.

Referring to FIG. 1, the organic light emitting display device includes a substrate 1 and a display unit 2 formed on a first surface 11 of the substrate 1.

In the above-described organic light emitting display device, external light transmits through the substrate 1 and the display unit 2. The display unit 2 is a both emission type light emitting unit, meaning an image is realized on two surfaces, as shown in FIG. 1.

The display unit 2 is formed such that external light may be transmitted therethrough as will be described later. Referring to FIG. 1, from a side where an image is formed, the user may view an image formed on an external lower surface of the substrate 1.

Figure 2:
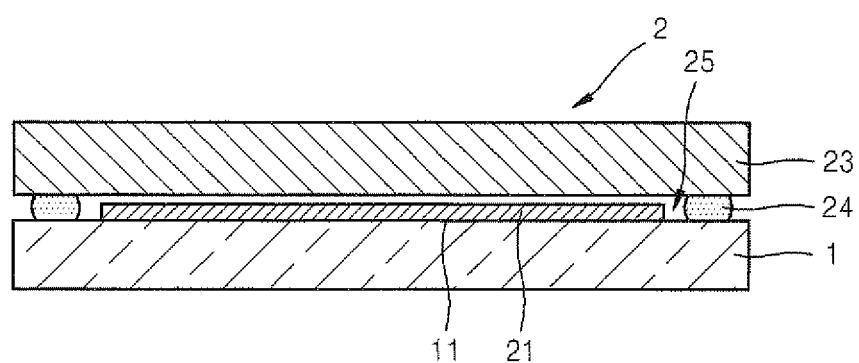
FIG. 2 is a detailed cross-sectional view of the organic light emitting display device of FIG. 1 according to an embodiment of the present invention.

FIG. 2 is a detailed cross-sectional view of the organic light emitting display device of FIG. 1 according to an embodiment of the present invention.

The display unit 2 includes an organic light emitting unit 21 formed on the first surface 11 of the substrate 1 and a sealing substrate 23 which seals the organic light emitting unit 21.

The sealing substrate 23 is formed of a transparent material, allows an image to be transmitted therethrough from the organic light emitting unit 21, and prevents penetration of air and water from outside into the organic light emitting unit 21.

The substrate 1 and the sealing substrate 23 are coupled to each other using a sealing member 24 which is formed on boundary portions of the substrate 1 and the sealing substrate 23, thereby sealing a space 25 between the substrate 1 and the sealing substrate 23.

Figure 3:
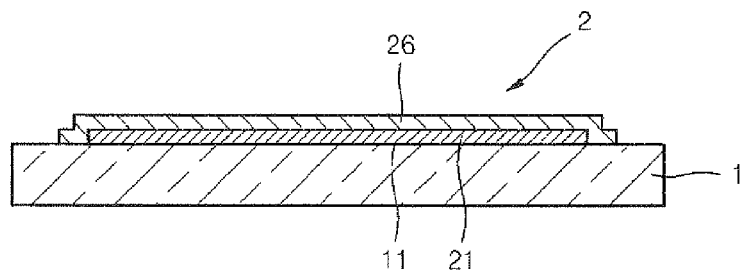
FIG. 3 is a detailed cross-sectional view of the organic light emitting display device of FIG. 1 according to another embodiment of the present invention.

FIG. 3 is a detailed cross-sectional view of the organic light emitting display device of FIG. 1 according to another embodiment of the present invention.

As illustrated in FIG. 3, a thin sealing film 26 is formed on the organic light emitting unit 21 to protect the organic light emitting unit 21 from air and water from outside. The sealing film 26 may have a structure in which a layer formed of an inorganic material, such as silicon oxide or silicon nitride, and a layer formed of an organic material, such as epoxy or polyimide, are alternately stacked, but is not limited thereto. The sealing film 26 may have any sealing structure which is a transparent thin film.

Figure 4:
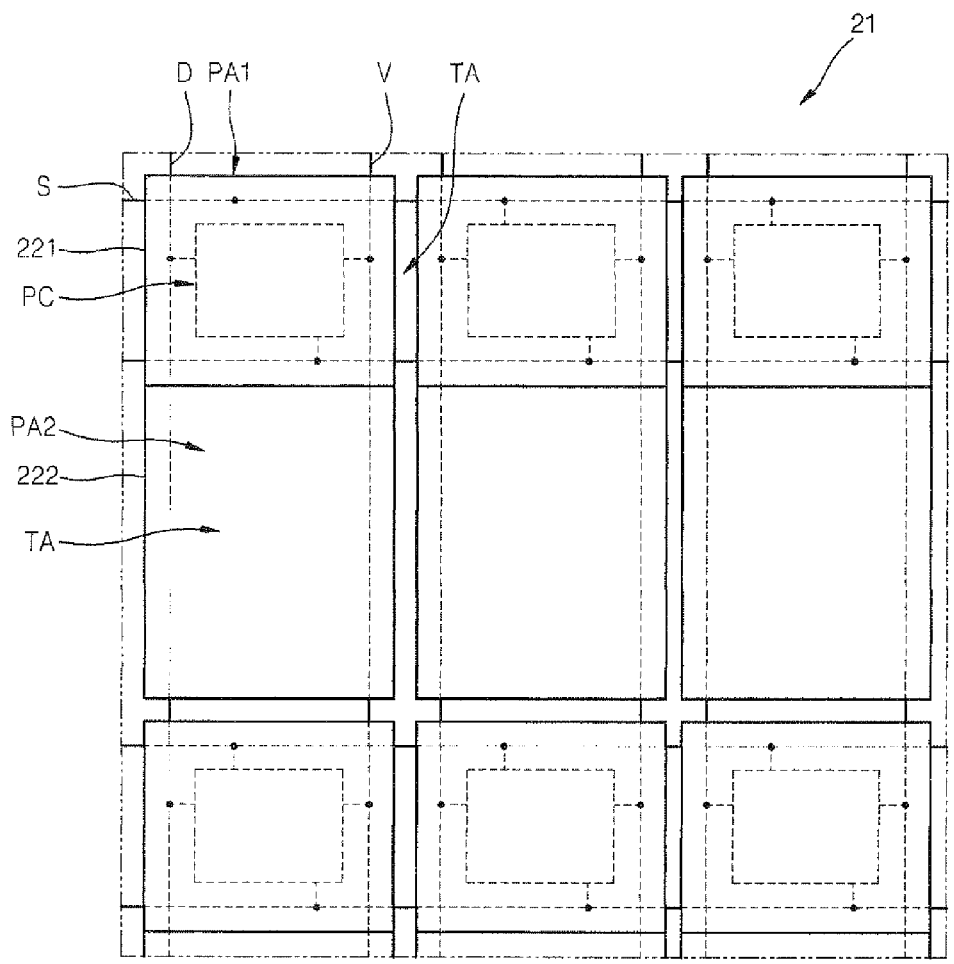
FIG. 4 is a schematic view illustrating an organic light emitting unit of FIG. 2 or FIG. 3 according to an embodiment of the present invention.
Figure 5:
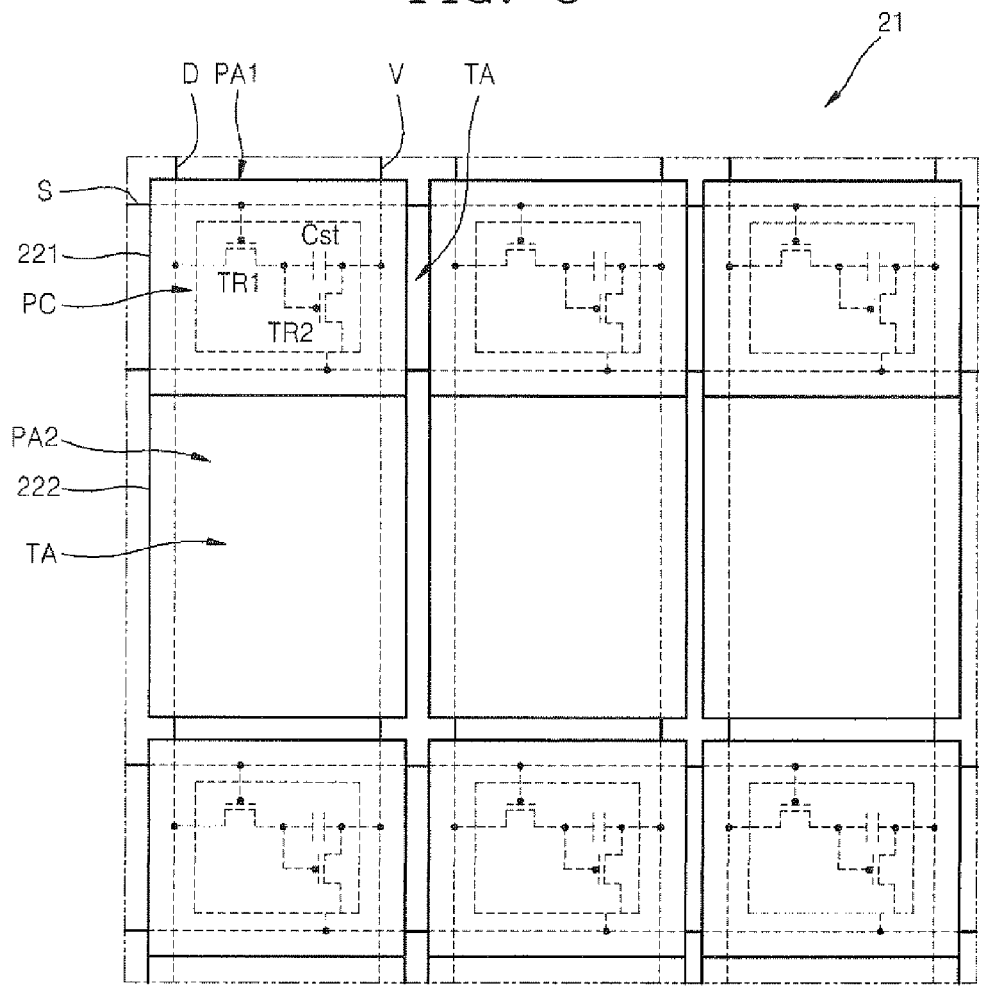
FIG. 5 is a schematic view illustrating an organic light emitting unit including a pixel circuit unit of FIG. 4 according to an embodiment of the present invention.

FIG. 4 is a schematic view illustrating the organic light emitting unit 21 of FIG. 2 or FIG. 3 according to an embodiment of the present invention, while FIG. 5 is a schematic view illustrating the organic light emitting unit 21 including a pixel circuit unit of FIG. 4 according to an embodiment of the present invention.

Referring to FIGS. 2 thru 5, the organic light emitting unit 21 is formed on the substrate 1 which includes a transmission area TA through which external light is transmitted and a plurality of first pixel areas PA1 which are separated between the transmission area TA. A plurality of second pixel area PA2 which are adjacent to the first pixel areas PA1 are formed on at least a portion of the transmission area TA. That is, in the second pixel areas PA2, external light may be both transmitted and emitted.

Referring to FIG. 4, a pixel circuit unit PC is included in each of the first pixel areas PA1, and a plurality of conductive lines (e.g., scan lines S, data lines D, and Vdd lines V) are electrically connected to the pixel circuit unit PC. Although not shown in FIG. 4, other various conductive lines, in addition to the scan lines S, data lines D, and Vdd lines V, may be further included according to the configuration of the pixel circuit unit PC.

Referring to FIG. 5, the pixel circuit unit PC includes a first thin film transistor (TFT) TR1 connected to a scan line S and a data line D, a second TFT TR2 connected to the first TFT TR1 and a Vdd line V, and a capacitor Cst connected to the first TFT TR1 and the second TFT TR2. Here, the first TFT TR1 is a switching transistor, and the second TFT TR2 is a driving transistor. The second TFT TR2 is electrically connected to a first pixel electrode 221. Although the first TFT TR1 and the second TFT TR2 are P-type transistors in FIG. 5, they are not limited thereto and at least one of them may also be an N-type transistor. The number of the TFTs and the capacitors Cst as described above is not limited to the above embodiment. According to the pixel circuit unit PC, two or more TFTs and one or more capacitors Cst may be combined therein.

Referring to FIGS. 4 and 5, the scan line S, the data line D, and the Vdd line V are arranged so as to overlap the first pixel electrode 221. However, the embodiment of the present invention is not limited thereto, and at least one of the plurality of conductive lines, including the scan line S, the data line D, and the Vdd line V, may overlap with the first pixel electrode 221, or all of the plurality of conductive lines, including the scan line S, the data line D, and the Vdd line V, may be arranged next to the first pixel electrode 221 according to circumstances.

As will be described later, the first pixel area PA1 becomes an area in which top emission is performed with a high optical outcoupling efficiency in each sub-pixel. Since the pixel circuit unit PC is disposed in the area of the top emission, the user may see an outside image through the transmission area TA including the second pixel area PA2. That is, since a conductive pattern of the pixel circuit unit PC, which is one of the largest factors that decreases transmittivity of the transmission area TA, is not included in the transmission area TA, the transmittivity of the transmission area TA is further increased.

As described above, according to the current embodiment of the present invention, the organic light emitting unit 21 is divided into the first pixel area PA1 and the transmission area TA, and most conductive patterns which may reduce the total transmittivity of the organic light emitting display device are disposed in the first pixel area PA1 so as to increase the transmittivity of the transmission area TA, thereby increasing the transmittivity of the whole area in which an image is formed (the organic light emitting unit 21 of FIG. 2 or FIG. 3), compared to a conventional transparent display device.

According to the current embodiment of the present invention, the pixel circuit unit PC overlaps with the first pixel area PA, and thus distortion of external images, which occurs due to diffusion of external light in regard to patterns of elements in the pixel circuit unit PC, may be prevented.

Although conductive lines, including scan lines S, data lines D, and Vdd lines V, may also be arranged across the transmission area TA between the first pixel area PA and another adjacent first pixel area PA1, these conductive lines are very thin and can only be seen by close observation of the user, and do not affect the total transmittivity of the organic light emitting unit 21. Thus, it does not affect the manufacture of a transparent display device. Also, even if the user may not see a portion of an external image covered by the first pixel area PA1, since the first pixel area PA1 is as an arrangement of a plurality of dots on a surface of a transparent glass when seen in regard to the whole display device, the user may see an external image without any problem.

The first pixel electrode 221, which is electrically connected to the pixel circuit unit PC, is included in the first pixel area PA1, and the pixel circuit unit PC overlaps with the first pixel electrode 221 so as to be covered by the first pixel electrode 221. Also, at least one of the above-described conductive lines, including the scan lines S, data lines D, and Vdd lines V, may be arranged to pass the first pixel electrode 221.

Also, since the conductive lines barely reduce the transmittivity of the organic light emitting display device compared to the pixel circuit unit PC, all of the conductive lines may be arranged adjacent to the first pixel electrode 221 according to the design of the organic light emitting display device. The first pixel electrode 221 includes a reflection layer formed of a light-reflecting conductive metal as will be described later, and thus the first pixel electrode 221 covers the pixel circuit unit PC which overlaps with the reflection layer, and prevents distortion of an external image due to the pixel circuit unit PC in the first pixel area PA1.

Meanwhile, a second pixel electrode 222 is further disposed in the transmission area TA to form the second pixel area PA2. As will be described later, the second pixel electrode 222 is formed of a light-transmissible metal oxide so that external light may be transmitted through the second pixel area PA2.

Figure 6:
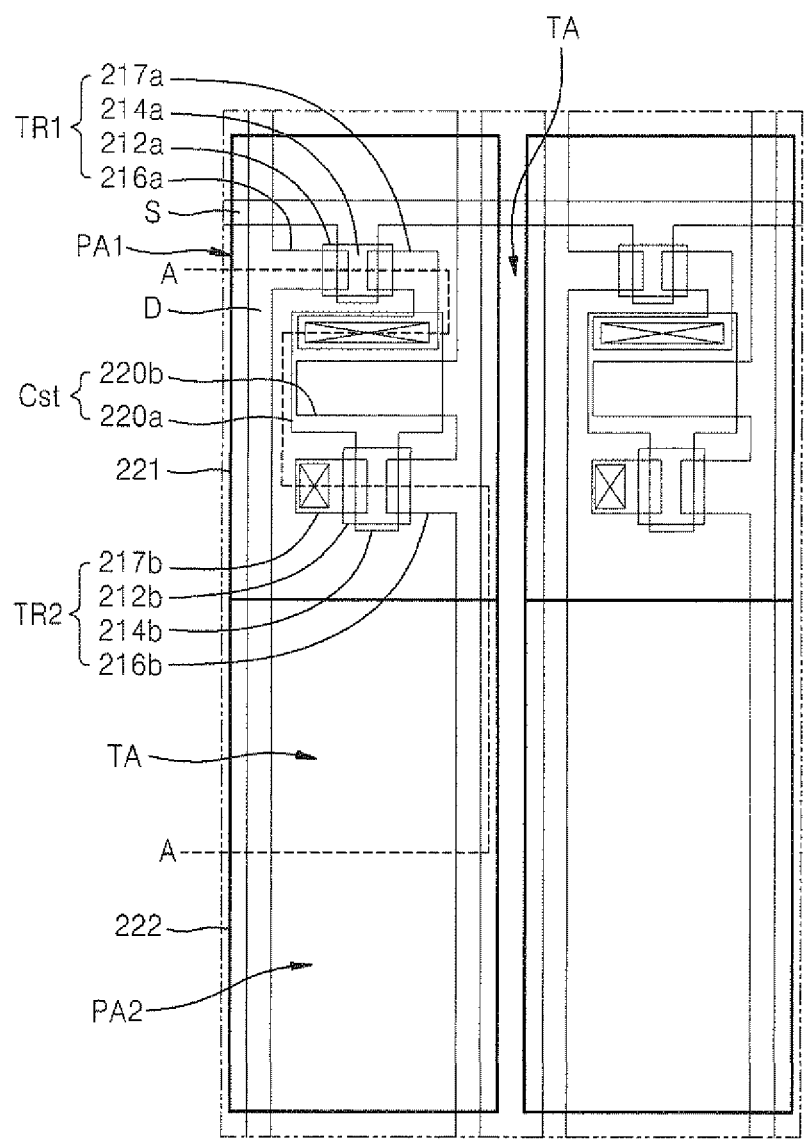
FIG. 6 is a detailed plan view illustrating the organic light emitting unit of FIG. 5 according to an embodiment of the present invention.
Figure 7:
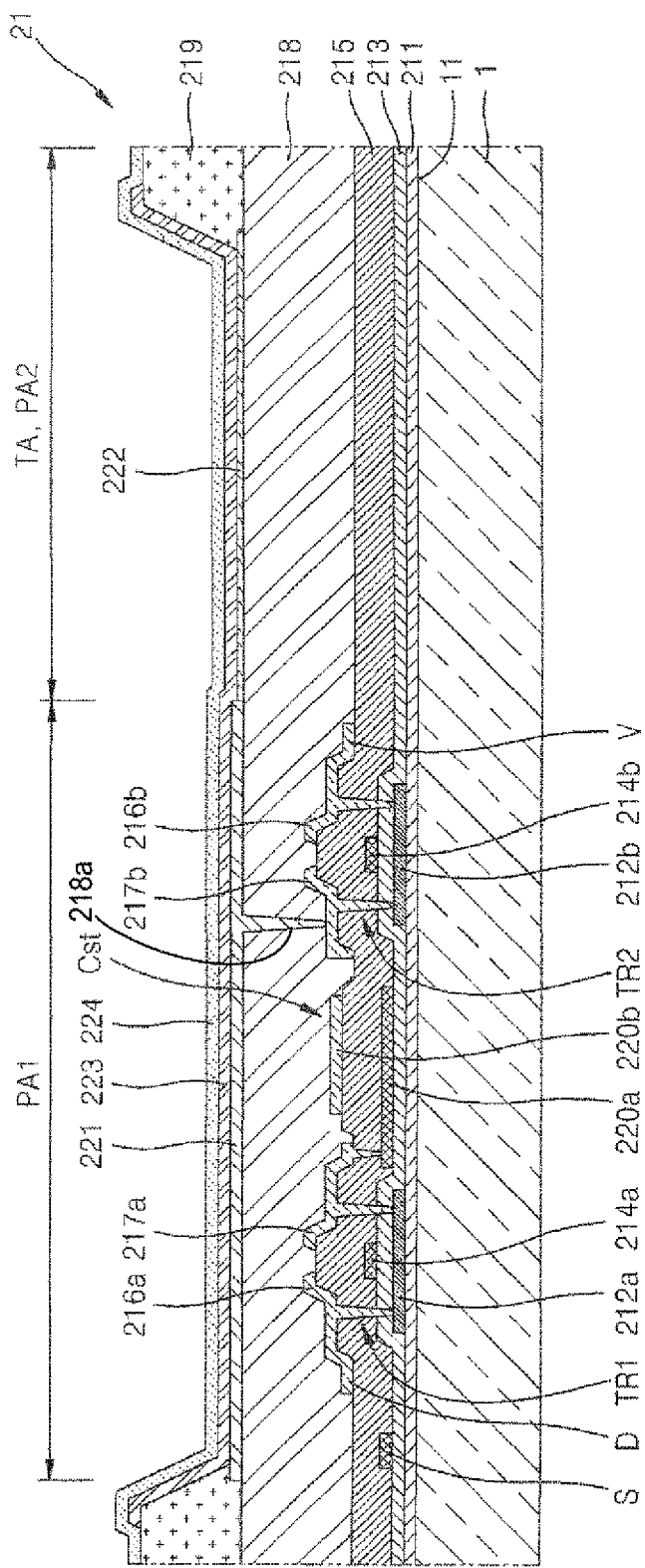
FIG. 7 is a cross-sectional view illustrating the organic light emitting display device of FIG. 6 along a line A-A.

FIG. 6 is a detailed plan view illustrating the organic light emitting unit according to an embodiment of the present invention, and shows the pixel circuit unit PC of FIG. 5, while FIG. 7 is a cross-sectional view illustrating the organic light emitting unit of FIG. 6 along a line A-A.

Referring to FIGS. 6 and 7, a buffer layer 211 is formed on the first surface 11 of the substrate 1, and the first TFT TR1, the capacitor Cst, and the second TFT TR2 are formed on the buffer layer 211.

First, a first semiconductor active layer 212a and a second semiconductor active layer 212b are formed on the buffer layer 211.

The buffer layer 211 prevents penetration of impurities into the organic light emitting unit 21 and planarizes a surface of the substrate 1, and may be formed of a material that performs these functions. For example, the buffer layer 211 may be formed of an inorganic material such as a silicon oxide, a silicon nitride, a silicon oxynitride, an aluminum oxide, an aluminum nitride, a titanium oxide, or a titanium nitride, or it may be formed of an organic material such as polyimide, polyester, or acryl, or a stack of these materials. Also, the buffer layer 211 may or may not be included according to necessity.

The first semiconductor active layer 212a and the second semiconductor active layer 212b may be formed of polysilicon, but are not limited thereto. The first semiconductor active layer 212a and the second semiconductor active layer 212b may also be formed of an oxide semiconductor. For example, the first semiconductor active layer 212a and the second semiconductor active layer 212b may be a G-I-Z-O layer [$(In_2O_3)a(Ga_2O_3)b(ZnO)c$ layer] (a, b, and c satisfy a≥0, b≥0, and c>0).

A gate insulating layer 213 is formed on the buffer layer 211 so as to cover the first semiconductor active layer 212a and the second semiconductor active layer 212b, and a first gate electrode 214a and a second gate electrode 214b are formed on the gate insulating layer 213.

An interlayer insulating layer 215 is formed on the gate insulating layer 213 so as to cover the first semiconductor active layer 212a and the second semiconductor active layer 212b, and a first source electrode 216a, a first drain electrode 217a, a second source electrode 216b, and a second drain electrode 217b are formed on the interlayer insulating layer 215 so as to contact the first semiconductor active layer 212a and the second semiconductor active layer 212b via a contact hole.

Referring to FIG. 7, the scan line S may be formed at the same time that the first gate electrode 214a and the second gate electrode 214b are formed. Also, the data line D is formed when the first source electrode 216a is formed and is connected to the first source electrode 216a, and the Vdd line V is formed when the second source electrode 216b is formed and is connected to the second source electrode 216b.

A bottom electrode 220a of the capacitor Cst is formed at the same time that the first gate electrode 214a and the second gate electrode 214b are formed, and a top electrode 220b of the capacitor Cst is formed at the same time that the first electrode 217a is formed.

The first TFT TR1, the capacitor Cst, and the second TFT T2 are not limited thereto, and other various structures thereof may also be formed. For example, the first TFT TR1 and the second TFT T2 described above have a top gate structure, but they may also have a bottom gate structure in which the first gate electrode 214a and the second gate electrode 214b are disposed below the first semiconductor active layer 212a and the second semiconductor active layer 212b. Also, other various TFT structures different from those described above may be used.

A passivation layer 218 is formed to cover the first TFT TR1, the capacitor Cst, and the second TFT T2. The passivation layer 218 may be a single insulating layer or a multi-layer insulating layer having a planarized upper surface. The passivation layer 218 may be formed of an inorganic and/or an organic material.

As illustrated in FIGS. 6 and 7, a first pixel electrode 221 is formed on the passivation layer 218 so as to cover the first TFT TR1, the capacitor Cst, and the second TFT T2. The first pixel electrode 221 is connected to the second drain electrode 217b of the second TFT TR2 by a via hole 218a formed in the passivation layer 218.

The second pixel electrode 222 is formed on the passivation layer 218 adjacent to the first pixel electrode 221. The first pixel electrode 221 and the second pixel electrode 222 are preferably connected to each other. As illustrated in FIG. 6, a connection structure of the first pixel electrode 221 and the second pixel electrode 222 is formed in each pixel as an isolated island.

A pixel defining layer 219 is formed on the passivation layer 218 so as to cover edges of the first pixel electrode 221 and the second pixel electrode 222. An organic layer 223 and an opposite electrode 224 are sequentially stacked on the first pixel electrode 221. The opposite electrode 224 may be formed over the whole first and second pixel areas PA1 and PA2, respectively, and the transmission area TA.

The organic layer 223 may be formed of a small molecular organic layer or a polymer organic layer. When formed of the small molecular organic layer, the organic layer 223 may be formed of a single layer formed of a hole injection layer (HIL), a hole transporting layer (HTL), an emission layer (EML), an electron transporting layer (ETL), an electron injecting layer (EIL) or a multi-layer structure including these. Examples of organic materials of the small molecular organic layer include copper phthalocyanine (CuPc), N,N'-Di(naphthalene-1-yl)-N,N'-diphenyl-benzidine (NPB), and tris-8-hydroxyquinoline aluminum) (Alq3). The small molecule organic layer may be formed by using a vacuum deposition method. The EML is formed in each of red, green, and blue pixels, and the HIL, the HTL, the ETL, and the EIL are common layers shared by the red, green, and blue pixels. Accordingly, as illustrated in FIG. 7, the HIL, the HTL, the ETL, and the EIL are formed to cover the whole first and second pixel areas PA1 and PA2 and the transmission area TA, just as the opposite electrode 224 is formed.

The first pixel electrode 221 and the second pixel electrode 222 may function as an anode electrode, and the opposite electrode 224d may function as a cathode, or the polarities of the first and second pixel electrodes 221 and 222, respectively, and the opposite electrode 224 may be exchanged.

The first pixel electrode 221 has a size corresponding to the first pixel area PA1 of each pixel. The second pixel electrode 222 has a size corresponding to the second pixel area PA2 of each pixel.

The opposite electrode 224 may be formed of a common electrode so as to cover all pixels of the organic light emitting unit 21.

According to the current embodiment of the present invention, the first pixel electrode 221 may include a reflection layer, and the opposite electrode 224 may be a semi-transmissive, semi-reflecting electrode. Accordingly, the first pixel area PA1 is a top emission type area in which an image is formed toward the opposite electrode 224.

To this end, the first pixel electrode 221 may include a reflection layer formed of Ag, Mg, Al, Pt, Pd, Au, Ni, Nd, Ir, Cr, Li, Ca, and a compound thereof, and a metal oxide layer formed of ITO, IZO, ZnO, or $In_2O_3$ having a high work function. The opposite electrode 224 may be formed of a metal having a small work function, e.g., Ag, Mg, Al, Pt, Pd, Au, Ni, Nd, Ir, Cr, Li, Ca, or an alloy thereof. The opposite electrode 224 may be formed of a thin film having a thickness of 100 to 300 Å. A transparent protection layer (not shown) may be further formed on the opposite electrode 224.

When the first pixel electrode 221 is a reflective electrode, the pixel circuit unit PC disposed therebelow is covered by the first pixel electrode 221. Accordingly, from an upper left side of the opposite electrode 224 of FIG. 7, the user may not see patterns of the first TFT TR1, the capacitor Cst, and the second TFT TR2.

Also, due to the first pixel electrode 221, which is a reflective electrode, light is emitted only to the user above the opposite electrode 224. Accordingly, the amount of light lost toward the opposite side of the user may be reduced. In addition, as described above, the first pixel electrode 221 covers various patterns of the pixel circuit unit PC therebelow, and thus the user may see a clearer transmission image.

Meanwhile, the second pixel electrode 222 is formed of a transparent electrode. The second pixel electrode 222 may be formed of a metal oxide layer, for example, ITO, IZO, ZnO, or $In_2O_3$ having a high work function without a reflection layer as described above. As the second pixel electrode 222 is transparent, the user may see a transmission image below the substrate 1 through the second pixel area PA2.

The second pixel electrode 222 may be formed at the same time that the first pixel electrode 221 is formed by patterning a transparent metal oxide layer of the first pixel electrode 221, except the reflection layer, so as to be extended to the second pixel electrode 222.

The passivation layer 218, the gate insulating layer 213, the interlayer insulating layer 215, and the pixel defining layer 219 are preferably formed of transparent insulating layers. The substrate 1 has a transmittivity which is smaller than or the same as the total transmittivity of the insulating layers.

Figure 8:
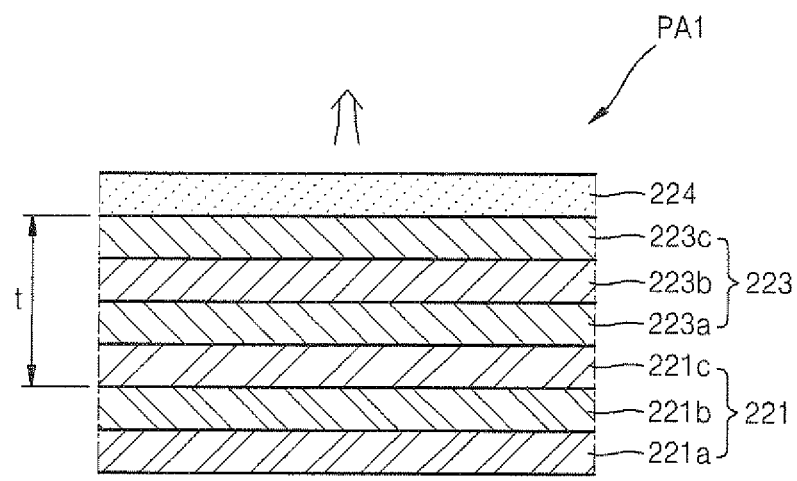
FIG. 8 is a detailed cross-sectional view illustrating a first pixel area of FIG. 7 according to an embodiment of the present invention.
Figure 9:
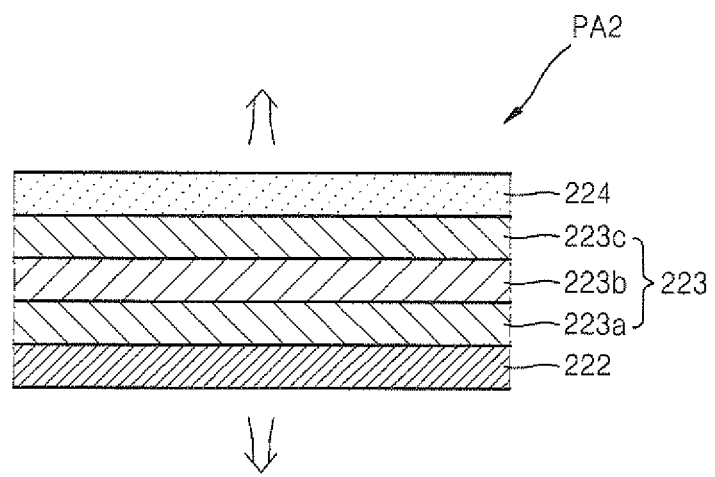
FIG. 9 is a detailed cross-sectional view illustrating a second pixel area of FIG. 7 according to an embodiment of the present invention.

FIG. 8 is a detailed cross-sectional view illustrating a first pixel area of FIG. 7 according to an embodiment of the present invention, and FIG. 9 is a detailed cross-sectional view illustrating a second pixel area of FIG. 7 according to an embodiment of the present invention.

The first pixel electrode 221 may be formed of a stack including a first transparent conductive layer 221a, a reflection layer 221b, and a second transparent conductive layer 221c. The first transparent conductive layer 221a and the second transparent conductive layer 221c may be formed of ITO, IZO, ZnO, or $In_2O_3$ having a high work function. The reflection layer 221b may be formed of Ag, Mg, Al, Pt, Pd, Au, Ni, Nd, Ir, Cr, Li, Ca or a compound thereof as described above.

An organic layer 223 including a first functional layer 223a, an emission layer 223b, and a second functional layer 223c is formed on the first pixel electrode 221, and an opposite electrode 224 is formed on the organic layer 223.

The first functional layer 223a may include an HIL and an HTL, and the second functional layer 223c may include an EIL and an ETL.

A distance t between a surface of the reflection layer 221b and the opposite electrode 224 is adjusted to form optical resonance with respect to a wavelength of light emitted from the emission layer 223b. Accordingly, the distance t may vary according to the red, green, and blue pixels. In order to adjust the distance t for generating optical resonance, an auxiliary layer (not shown) which allows the distance t to vary according to the color of the pixels may be further formed on the first functional layer 223a and/or the second functional layer 223c.

The first pixel area PA1 having the above-described structure is a top emission type area in which an image is formed toward the opposite electrode 224, and an optical outcoupling efficiency thereof may be maximized by adjusting the distance t so as to generate optical resonance.

Meanwhile, the second pixel electrode 222 is formed of only a transparent conductive material without a reflection layer as described above. Accordingly, at least one of the first transparent conductive layer 221a and the second transparent conductive layer 221c of the first pixel electrode 221 may be extended to form the second pixel electrode 222.

The organic layer 223, including a first functional layer 223a, an emission layer 223b, and a second functional layer 223c, is formed on the second pixel electrode 222, and an opposite electrode 224 is formed on the organic layer 223.

Since the second pixel electrode 222 of the second pixel area PA2 does not include a reflection layer, an optical resonance distance as described above does not need to be adjusted. Also, the second pixel area PA2 is a both (top and bottom) emission type area which forms an image toward the opposite electrode 224 and the second pixel electrode 222. Accordingly, when the display unit 2 operates, the second pixel area PA2 forms an image as a both emission type area, and when the display unit 2 does not operate, the second pixel area PA2 is a transmission area through which an external image is transmitted. Also, since the second pixel area PA2 does not use optical resonance, the optical outcoupling efficiency thereof is decreased. Due to these characteristics, the user may view an external transmission image through the second pixel area PA2, even when the display unit 2 operates.

Accordingly, when the position of the user is above the opposite electrode 224, the user may view a clear and bright image with a high optical outcoupling efficiency through the first pixel area PA1, and may also view a vague external transmission image through the second pixel area PA2 at the same time.

Meanwhile, according to the current embodiment of the present invention, in order to further increase transmittivity of the transmission area TA and prevent optical interference due to multi-layer transparent insulating layers in the transmission area TA and a decrease in color purity, and discoloration due to the optical interference, an opening 229 is formed in at least a portion of the insulating layers in at least an area corresponding to the second pixel area PA2.

According to the current embodiment of the present invention, the area of the transmission area TA needs to be increased or transmittivity of materials formed in the transmission area TA needs to be increased in order to increase transmittivity of external light of the transmission area TA. However, it is difficult to increase the area of the transmission area TA due to restrictions in the design of the pixel circuit unit PC. Consequently, the transmittivity of the materials formed in the transmission area TA needs to be increased. However, it is also difficult to increase the transmittivity of the materials due to the limitations in terms of development of the materials. In addition, since the second pixel area PA2 mostly occupies the area of the transmission area TA, it is difficult to increase the transmittivity of external light through the transmission area TA.

Accordingly, according to the current embodiment of the present invention, an opening 229 (described below in connection with FIG. 10) is formed in at least a portion of the insulating layers in at least an area corresponding to the second pixel area PA2.

Figure 10:
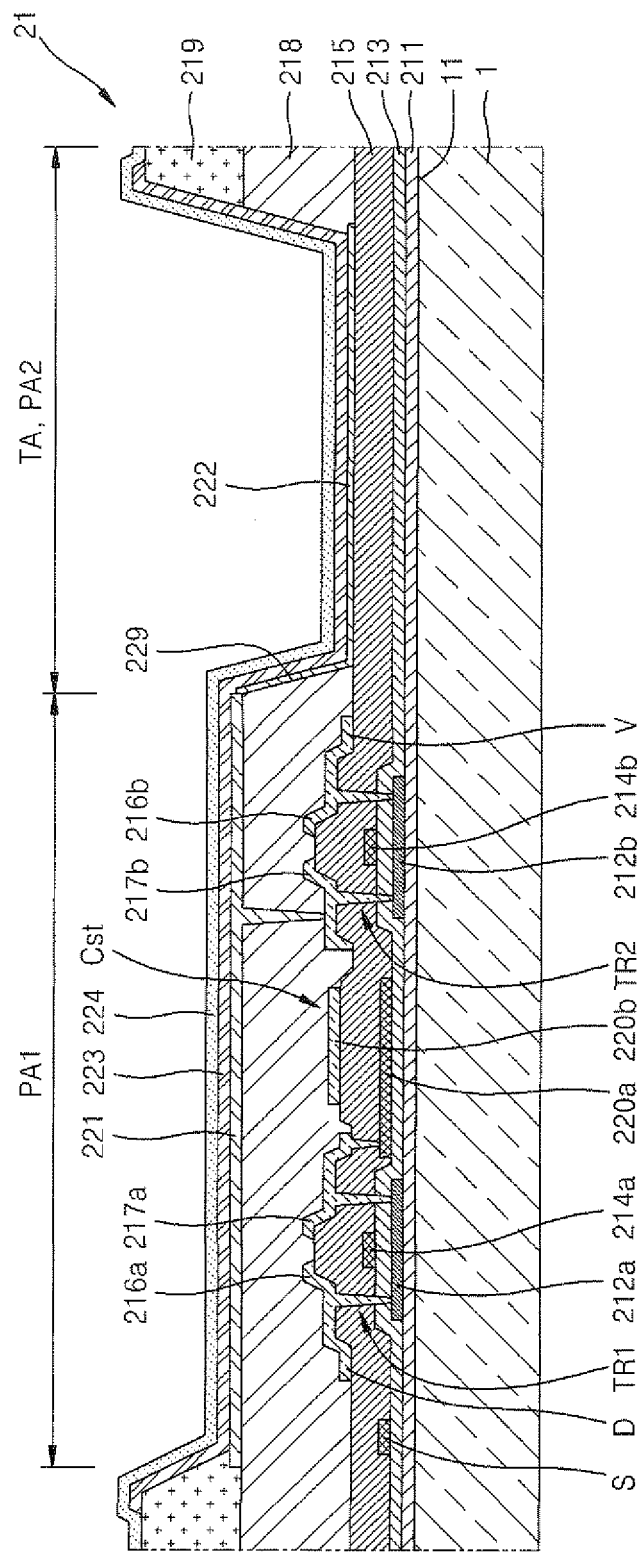
FIG. 10 is a cross-sectional view illustrating an organic light emitting unit according to another embodiment of the present invention.

FIG. 10 is a cross-sectional view illustrating an organic light emitting unit according to another embodiment of the present invention.

Referring to FIG. 10, in the organic light emitting unit 21, the opening 229 is formed in the passivation layer 218 which covers the pixel circuit unit PC. In FIG. 10, the opening 229 is formed in the passivation layer 218, but the present invention is not limited thereto. Also, openings that are connected to the opening 229 may be further formed in at least one of the interlayer insulating layer 215, the gate insulating layer 213, and the buffer layer 211 to thereby further increase the transmittivity of the transmission area TA. Provided that the opening 229 does not contact the scan line S, the data line D, and the Vdd line V, the opening 229 may preferably be formed as wide as possible.

According to the present invention, a transparent organic light emitting display device having an increased transmittivity with respect to external light and an increased optical outcoupling efficiency during double-sided light emission is obtained.

Also, a transparent organic light emitting display device in which diffusion of light being transmitted is reduced to prevent distortion of a transmission image is obtained.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light emitting display device, comprising:
   a substrate;
   a plurality of thin film transistors (TFTs) formed on a first surface of the substrate;
   a passivation layer covering the plurality of TFTs;
   a plurality of first pixel electrodes formed on the passivation layer and respectively electrically connected to the plurality of TFTs, said first pixel electrodes overlapping with the plurality of TFTs so as to cover the plurality of TFTs, said first pixel electrodes including a reflection layer formed of a light-reflecting conductive material;
   a second pixel electrode formed of a light-transmissible conductive material and disposed on the passivation layer so as to be respectively electrically connected to the plurality of first pixel electrodes, a substantial portion of the first pixel electrodes not overlapping with the second pixel electrode, a substantial portion of the second pixel electrode not overlapping with the first pixel electrodes;

an opposite electrode formed so that light is transmitted and reflected therethrough, said opposite electrode being disposed opposite to the plurality of first pixel electrodes and the second pixel electrode; and an organic layer interposed between the plurality of first and second pixel electrodes and the opposite electrode, and including an emission layer.

2. The organic light emitting display device of claim 1, wherein the opposite electrode comprises at least one metal selected from the group consisting of Ag, Mg, Al, Pt, Pd, Au, Ni, Nd, Ir, Cr, Li, Ca, and alloys thereof.

3. The organic light emitting display device of claim 1, wherein the second pixel electrode is formed of at least one metal oxide selected from the group consisting of ITO, IZO, ZnO, and $In_2O_3$.

4. The organic light emitting display device of claim 1, wherein the plurality of first pixel electrodes and the second pixel electrode are connected to each other.

5. The organic light emitting display device of claim 1, wherein the reflection layer comprises at least one metal selected from the group consisting of Ag, Mg, Al, Pt, Pd, Au, Ni, Nd, Ir, Cr, Li, Ca, and alloys thereof.

6. An organic light emitting display device, comprising:
a substrate which is partitioned into a transmission area and a plurality of first pixel areas which are spaced apart from one another between the transmission area;
a plurality of pixel circuit units formed on a first surface of the substrate, each of said pixel circuits comprising at least one thin film transistor (TFT) and being formed in each of the plurality of first pixel areas;
a passivation layer covering the plurality of pixel circuit units and formed in the transmission area and the plurality of first pixel areas;
a plurality of first pixel electrodes formed on the passivation layer and respectively electrically connected to the plurality of pixel circuits, said first pixel electrodes overlapping with the plurality of pixel circuits so as to cover the plurality of pixel circuits, and said first pixel electrodes including a reflection layer formed of a light-reflecting conductive material;
a second pixel electrode formed of a light-transmissible conductive material and disposed on the passivation layer so as to be respectively electrically connected to the plurality of first pixel electrodes;
an opposite electrode formed so that light is transmitted and reflected therethrough, said opposite electrode being disposed opposite the plurality of first pixel electrodes and the second pixel electrode; and
an organic layer interposed between the plurality of first and second pixel electrodes and the opposite electrode, and including an emission layer.

7. The organic light emitting display device of claim 6, wherein the opposite electrode comprises at least one metal selected from the group consisting of Ag, Mg, Al, Pt, Pd, Au, Ni, Nd, Ir, Cr, Li, Ca, and alloys thereof.

8. The organic light emitting display device of claim 6, wherein the second pixel electrode is formed of at least one metal oxide selected from the group consisting of ITO, IZO, ZnO, and $In_2O_3$.

9. The organic light emitting display device of claim 6, wherein the plurality of first pixel electrodes and the second pixel electrode are connected to each other.

10. The organic light emitting display device of claim 6, wherein the reflection layer comprises at least one metal selected from the group consisting of Ag, Mg, Al, Pt, Pd, Au, Ni, Nd, Ir, Cr, Li, Ca, and alloys thereof.

11. The organic light emitting display device of claim 6, further comprising a plurality of conductive lines electrically connected to the plurality of pixel circuit units, wherein at least one of the conductive lines is arranged to overlap with each of the first pixel electrodes.

12. The organic light emitting display device of claim 6, wherein the passivation layer is formed of a transparent material.

13. The organic light emitting display device of claim 6, further comprising a second emission area in which light is emitted toward the substrate and the opposite electrode, and which is disposed in at least a portion of the transmission area corresponding to the second pixel electrode.

14. The organic light emitting display device of claim 13, further comprising a plurality of insulating layers disposed in an area corresponding to the transmission area.

15. The organic light emitting display device of claim 14, wherein at least one of the plurality of insulating layers comprises an opening formed in at least an area of the second pixel area.

* * * * *